United States Patent [19]

Onodera

[11] Patent Number: 5,101,246

[45] Date of Patent: Mar. 31, 1992

[54] PHOTO-FUNCTIONAL DEVICE

[75] Inventor: Noriaki Onodera, Sendai, Japan

[73] Assignees: Ricoh Company, Ltd., Tokyo; Ricoh Research Institute of General Electronics Co., Ltd., Natori, both of Japan

[21] Appl. No.: 444,952

[22] Filed: Dec. 4, 1989

[30] Foreign Application Priority Data

Dec. 8, 1988 [JP] Japan .................. 63-308820

[51] Int. Cl.⁵ .............................. H01L 31/12
[52] U.S. Cl. ........................ 357/19; 357/55; 372/50
[58] Field of Search ............... 357/19, 17, 55; 372/43, 372/45, 46, 50

[56] References Cited

U.S. PATENT DOCUMENTS

| | | | |
|---|---|---|---|
| 4,614,958 | 9/1986 | Mikami et al. | 357/19 |
| 4,794,609 | 12/1988 | Hara et al. | 357/19 |
| 4,801,993 | 1/1989 | Ankri et al. | 357/19 |

FOREIGN PATENT DOCUMENTS

| | | | |
|---|---|---|---|
| 52-49787 | 4/1977 | Japan | 357/19 |
| 55-74190 | 6/1980 | Japan | 357/19 |
| 57-166081 | 10/1982 | Japan | 357/19 |
| 58-153378 | 9/1983 | Japan | 357/19 |
| 60-85579 | 5/1985 | Japan | 357/19 |
| 62-14479 | 1/1987 | Japan | 357/19 |
| 62-274789 | 11/1987 | Japan | 357/19 |
| 62-274790 | 11/1987 | Japan | 357/19 |
| 1-150357 | 6/1989 | Japan | 357/19 |

Primary Examiner—Rolf Hille
Assistant Examiner—Minhloan Tran
Attorney, Agent, or Firm—Oblon, Spivak, McClelland, Maier & Neustadt

[57] ABSTRACT

A photo-functional device has a semiconductor substrate, a light emitting section laminated on one surface of the semiconductor substrate and formed into a semiconductor laminate, a light receiving section laminated on the one surface of the semiconductor substrate, formed into a semiconductor laminate and electrically connected in series to the light emitting section, and a coupling rate conversion section disposed between the light emitting section and the light receiving section for converting a coupling rate of light coupled from the light emitting section to the light receiving section.

2 Claims, 7 Drawing Sheets

PHOTO-FUNCTIONAL DEVICE

BACKGROUND OF THE INVENTION

The present invention relates to a photo-functional device, particularly to a semiconductor photo-functional device in which a light emitting section and a light receiving section are formed on the same semiconductor substrate.

As a semiconductor device in the field of optoelectronics utilizing the excellent properties of light, there is a semiconductor photo-functional device in which light emitting devices and light receiving devices are integrally formed. This photo-functional device is a device having an all-mesa type structure. A hetero junction phototransistor, composed of P-InGaAsP and N-InP, which serves as a light receiving section, and a doublehetero junction light emitting diode, composed of P-InP, n-InGaAsP, and N-InP, which serves as a light emitting section, are integrated vertically on an n-InP substrate via a buffer using N-InP. The electrodes of the device are formed on the upper surface of the diode and the lower surface of the substrate. The characteristics of differential gain, optical bistablity and optical switching have been obtained by controlling light feedback.

However, since the light emitting section and the light receiving section of the photo-functional device of an all-mesa type are integrated vertically, controlling the amount of light feedback is difficult. Therefore, it was difficult to control the input-output light characteristics. Aligning the position of the electrode on the rear side of a substrate with the mesa section for growing a light emitting section was difficult. In the structure of a device by the prior art, when a device is formed as a two-dimensional array, there exist various problems such as the method of supporting a wafer and heat dissipation when it is put into practical use. There was another undesirable point, namely that the number of layers for epitaxial growth is eight or greater, so that at least twice as many layers must be grown for epitaxy.

SUMMARY OF THE INVENTION

The present invention has been devised to solve the above-described problems. It is an object of the present invention to provide a photo-functional device having excellent heat dissipation, small number of epitaxial growth layers, and which can easily be controlled for light feedback, aligned and formed into a two-dimensional array.

According to the present invention, the above-described objects can be attained by using a photo-functional device having a semiconductor substrate, a light emitting section laminated on one surface of the semiconductor substrate and formed into a semiconductor laminate, a light receiving section laminated on the one surface of the semiconductor substrate, formed into a semiconductor laminate and electrically connected in series to the light emitting section, and a coupling rate conversion section disposed between the light emitting section and the light receiving section for converting a coupling rate of light coupled from the light emitting section to the light receiving section.

In the photo-functional device of the present embodiment, the light receiving section and the light emitting section are formed on the same semiconductor laminate formed on the semiconductor substrate so that they are connected in series electrically. As a result of this, light feedback is generated from the light emitting section to the light receiving section, thereby generating a non-linear or linear response between the input and the output light.

The device of the present invention has a smaller number of growth layers than that of the prior art, and only one growth is needed. Further, in the device of the present invention, the light receiving section and the light emitting section are formed on the side of a growth layer. For this reason, alignment on the front and side of substrate is not required. A hetero-junction photo-transistor used as a light receiving section and a light emitting diode used as a light emitting section are easily formed from a same growth layer. For the device of the present invention, the light feedback rate, that is, the coupling rate of light coupled from the light emitting section to the light receiving section can also be easily controlled by the depth of a separation groove and by burying a material to the inside of this groove. In addition, since the wave-lengths for which light can be received can be selected from a wide range by changing the prohibition bandwidth of an n-GaAs layer, a p-GaAs layer and an n-Al$_x$Ga$_{1-x}$As (0.1<x<0.5) layer, the separation of input light from output light is easy. The photo-functional device in accordance with the present invention can contact an all-surface heat sink. Therefore, since it has excellent heat dissipation when it is formed into a large area array and can be tightly supported, it is very useful for a device for image information processing.

DETAILED DESCRIPTION OF THE PREFERRED EMBODIMENTS

The embodiment of the photo-functional device in accordance with the present invention will now be explained with reference to the accompanying drawings.

Figure 1:
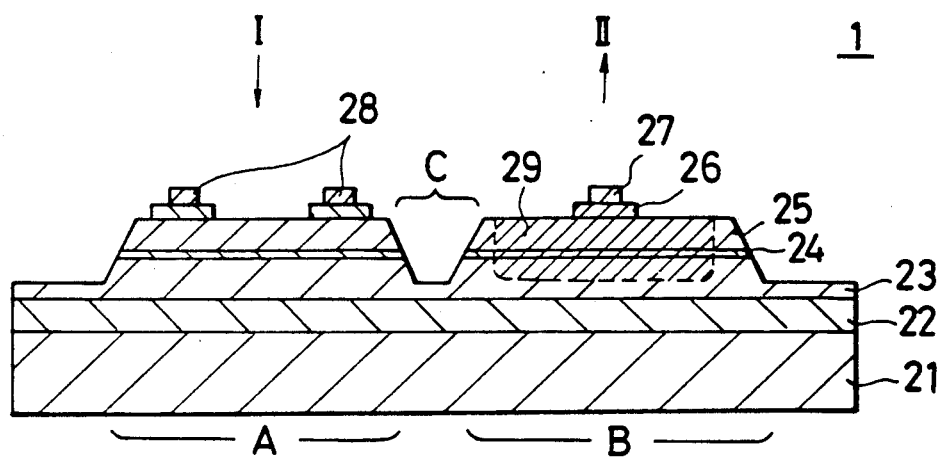
FIG. 1 is an cross sectional view illustrating the sectional end surface of the embodiment for the photofunctional device in accordance with the present invention.
Figure 10:
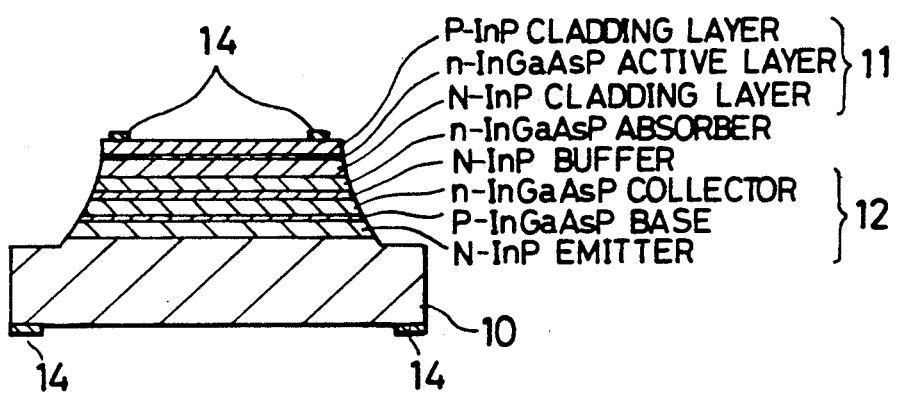
FIG. 10 is an end surface view illustrating the photo-functional device of the prior art, which is an all-mesa type integrated vertically to the substrate surface.

Referring to FIG. 1, there is shown a cross sectional view of the photo-functional device of the present basic embodiment 1. Unlike the device of the prior art shown in FIG. 10, that is, a device 50 comprising a substrate 10, a light emitting section 11, a light receiving section 12 and an electrode 14, the photo-functional device in the present embodiment is a light-emitting and light-receiving device having the light receiving section A and the light emitting section B, and is formed by a semiconductor laminate grown on an n-GaAs substrate 21. In other words, the device 1 is formed of a laminate of an -n-$Al_xGa_{1-x}As$ $(0.1<x<0.5)$ layer 22, an n-GaAs layer 23, a p-GaAs layer 24, an n-$Al_xGa_{1-x}As$ $(0.1<x<0.5)$ layer 25 and an n-GaAs layer 26 on an n-GaAs substrate 21 as shown in the same figure, and this laminate is used for the light receiving section A and the light emitting section B. As shown in the shaded portion of FIG. 1, as for the light emitting area, a p-n junction surface is formed and demarcated by Zn-diffusion to the n-GaAs layer 23 through an n-GaAs layer 26. A p-type ohmic electrode 27 is formed on the Zn-diffused area of the light emitting section B, and an n-type ohmic electrode 28 is formed on the area where the light receiving A is to be formed as shown in the same figure respectively. The light receiving section A and the light emitting section B are electrically separated by the groove C. The light receiving section A receives incident light from the direction of arrow I, and the light emitting section B emits light in the direction of arrow II. Light generated in the light emitting section B can be connected to the light receiving section A via the groove C, the semiconductor layer in the lower part of the groove C and the substrate 21. The light emitting section B of the photo-functional device 1 is shown by taking a surface light emitting device as an example.

Figure 2A:
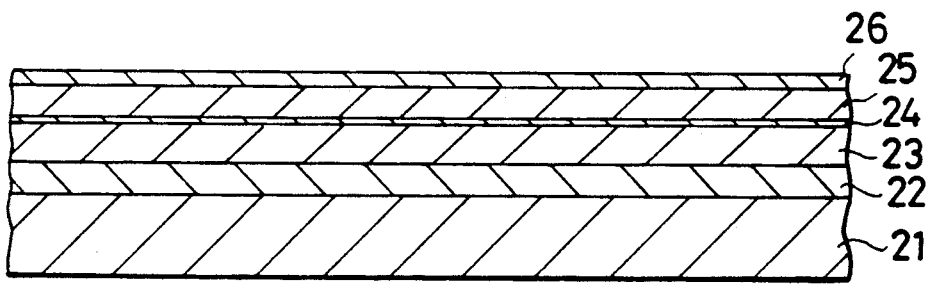
FIGS. 2A to 2H are cross sectional views exemplifying a portion of the process in which the photo-functional device shown in FIG. 1 is manufactured.

The photo-functional device 1 shown in FIG. 1 is, for example, manufactured in the process shown in FIGS. 2A to 2H. First, as shown in FIG. 2A, the n-$Al_xGa_{1-x}As$ $(0.1<x<0.5)$ layer 22, the n-GaAs layer 23, the p-GaAs layer 24, the n-$Al_xGa_{1-x}As$ $(0.1<x<0.5)$ layer 25 and the n-GaAs layer 26 are grown in turn on the n-GaAs substrate 21. The thickness of each layer at this time should preferably be, for example: about 1 to 2 $\mu$m for the n-$Al_xGa_{1-x}As$ $(0.1<x<0.5)$ layer 22, about 3 to 5 $\mu$m for the n-GaAs layer 23, about 0.05 to 1.0 $\mu$m for the p-GaAs layer 24, about 1 to 2 $\mu$m for the n-$Al_xGa_{1-x}As$ $(0.1<x<0.5)$ layer 25 and about 0.1 to 3.0 $\mu$m for the n-GaAs layer 26.

Figure 2B:
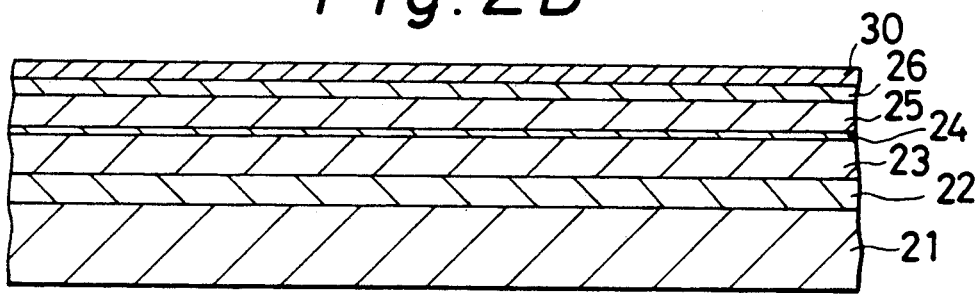
Figure 2C:
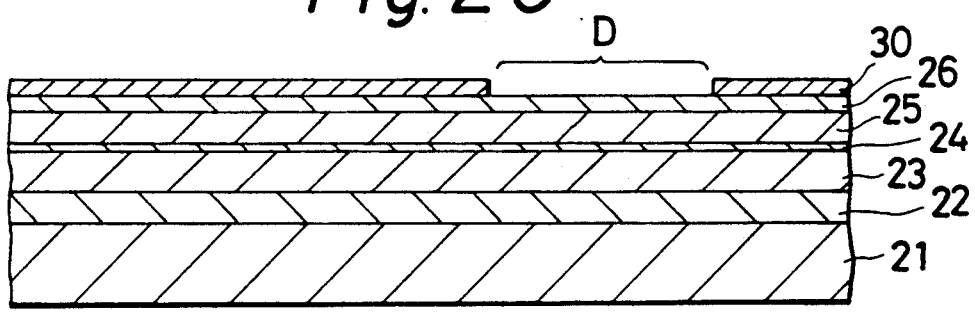
Figure 2D:
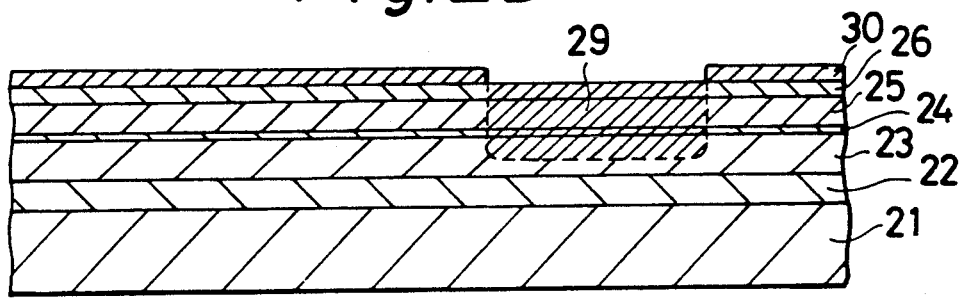

Next, as shown in FIG. 2B, a mask 30 for Zn-diffusion is accumulated on the n-GaAs layer 26. As the mask 30, for example, silicon oxide or silicon nitride is used. After the mask 30 for Zn-diffusion is accumulated, a window D used for diffusion by etching is formed on this mask 30 (FIG. 2C). After the window D is formed, a Zn-diffusion 29 is performed until the front surface reaches inside of the n-GaAs layer 23 through the window D as shown in the shaded portion of FIG. 2D.

The shape of this Zn-diffusion region can be changed depending on whether the light emitting section B (FIG. 1) described later is made a surface light emitting type or an end surface light emitting type.

Figure 2E:
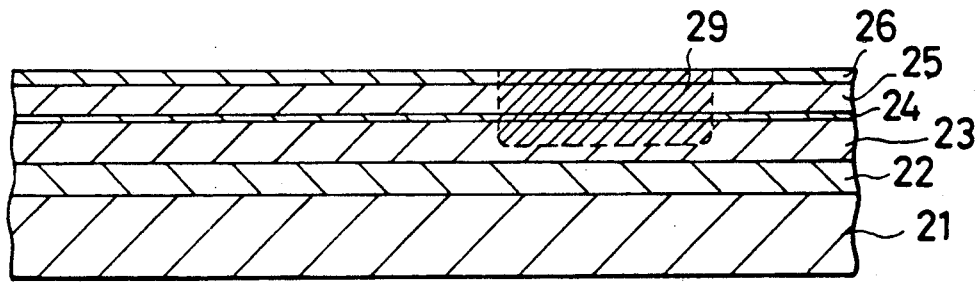
Figure 2F:
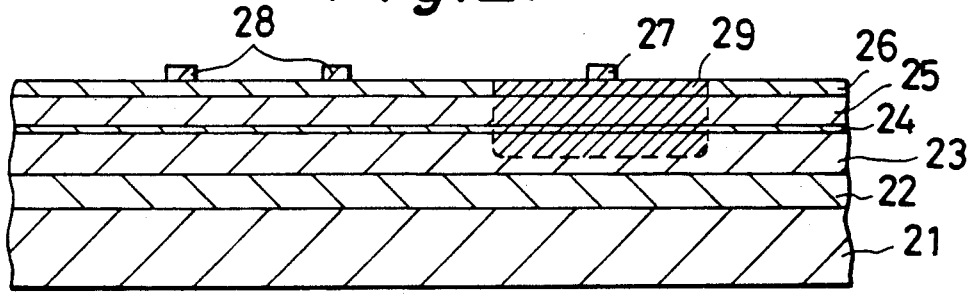
Figure 2G:
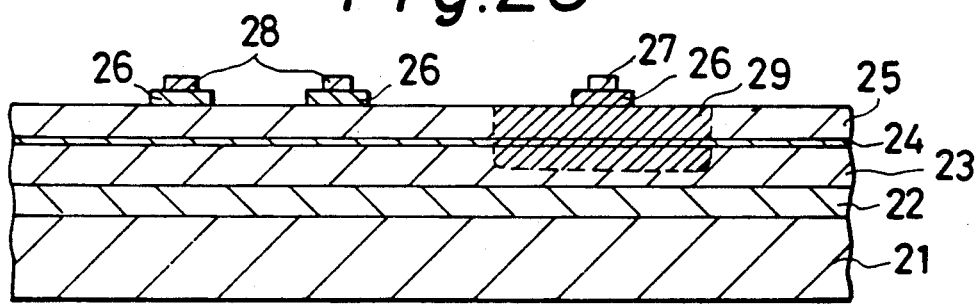
Figure 2H:
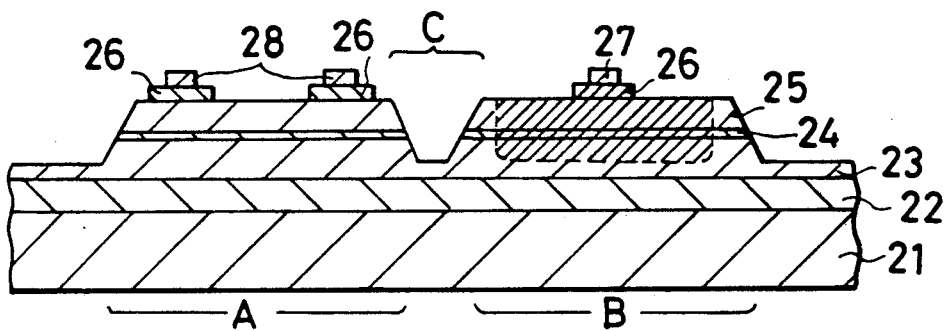

After the Zn-diffusion, the mask 30 used for diffusion is removed as shown in FIG. 2E. Next, a p-type ohmic electrode 27 is formed on the Zn-diffused region where the light emitting section B is to be formed, and an n-type ohmic electrode 28 is formed on the region where the light receiving section A is to be formed (FIG. 2F). After these electrodes are formed, the n-GaAs layer 26 is removed, if necessary, by etching with only the lower part of each electrode remained as shown in FIG. 2G. At this time, if $NH_4OH:H_2O_2 = 1:20$ is used as an etchant, for example, the etching can be stopped on the upper surface of the n-$Al_xGa_{1-x}As$ $(0.1<x<0.5)$ layer 25. After the n-GaAs layer 26 is removed, the etching for separating the light receiving section A and the light emitting section B, that is, the forming of the groove C is performed.

The etching is performed until it reaches the n-GaAs layer 23 through the p-GaAs layer 24 as shown in the figure. As described later, this etching can be performed more deeply as required.

Figure 3:
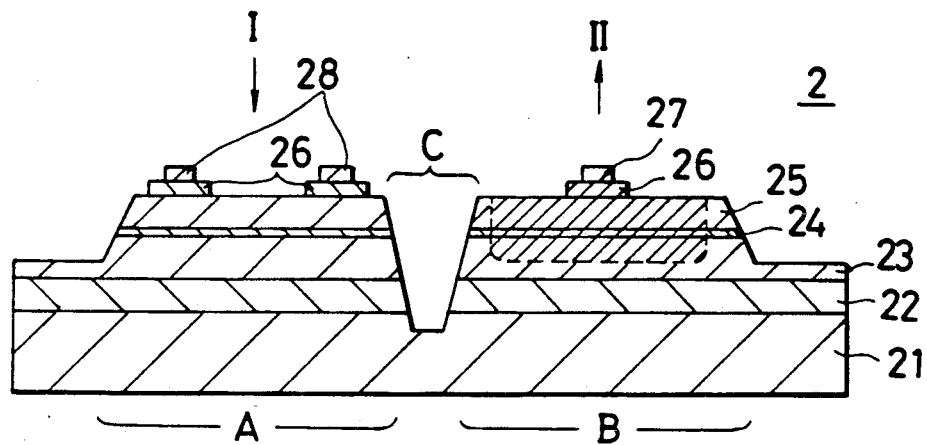
FIGS. 3 to 6 are cross sectional views illustrating the sectional end surface of another embodiment of the photo-functional device in accordance with the present invention.

FIG. 3 shows a photo-functional device 2 of embodiment 2, which is a photo-functional device whose coupling rate of light coupled from the light emitting section B to the light receiving section A is made smaller. That is, the coupling rate of light coupled from the light emitting section B to the light receiving section A is made small by etching the groove C more deeply than that of the photo-functional device 1. As mentioned above, the coupling rate of light coupled from the light emitting section B to the light receiving section A can be easily changed by changing the depth of the groove C.

Figure 4:
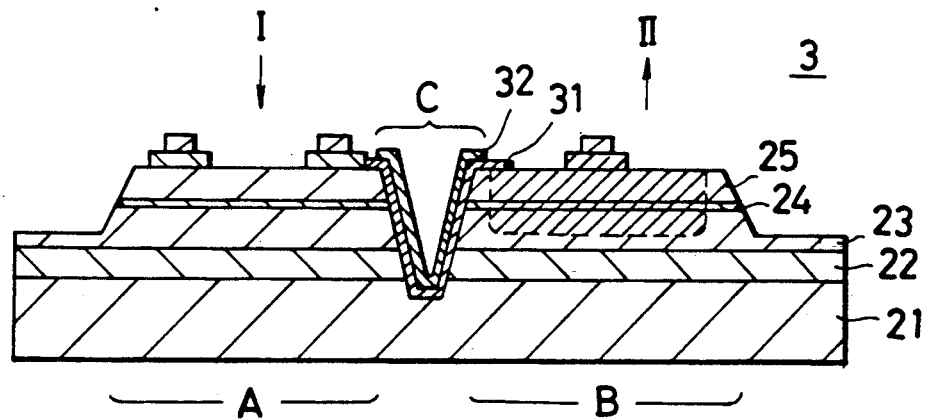

FIG. 4 shows a photo-functional device 3 of embodiment 3, whose coupling rate of light coupled from the light emitting section B to the light receiving section A is changed by another means. That is, in the photo-functional device 3, an insulation film 31 such as silicon oxide or silicon nitride is accumulated on the groove C. By depositing a metal 32 such as gold or aluminum on the upper portion of this insulation film 31, the coupling rate of light coupled from the end surface of the light emitting section B to the light receiving section A is decreased. As described above, the coupling rate of light can also be changed easily by depositing the insulation film 31 and the metal 32.

Figure 5:
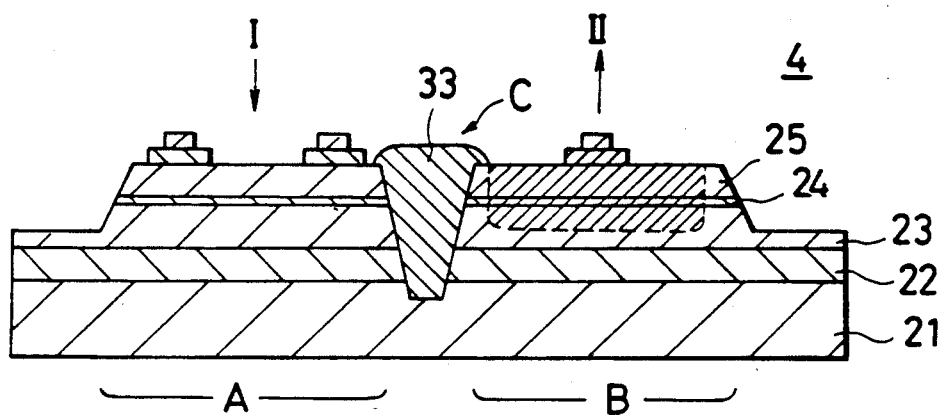

FIG. 5 shows a photo-functional device 4 of embodiment 4, in which an insulating and light-absorbing material 33 is buried in the groove C.

By using the photo-functional device 4 formed in such a manner, the coupling rate of light coupled from the end surface of the light emitting section B to the light receiving section A is also decreased in the embodiment in the same manner as in the embodiment 3. In the photo-functional device 4, if a transparent material is used for the material 33 and the index of refraction is made to close to that of a laminated semiconductor layer, conversely the coefficient of light connection can be increased.

In addition to the method of the embodiments explained above, the coupling rate of light can also be changed by changing the distance between the light receiving section A and the light emitting section B.

Figure 6:
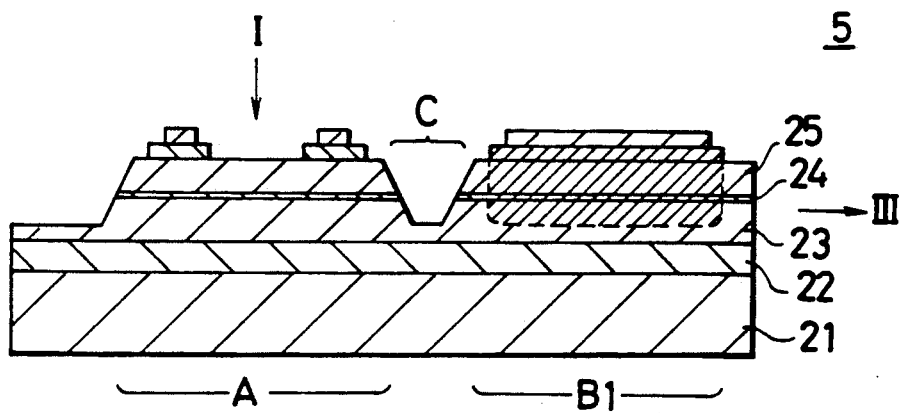

The photo-functional devices 1 to 4 are devices having the light emitting section B of a surface light emitting type, which leads out the light emission upwardly perpendicular to the surface of a substrate from the light emitting section B. However, the present invention is not particularly limited to a photo-functional device of the surface light emitting type. FIG. 6 shows a photo-functional device 5 of the embodiment of the end surface light emitting type. This device 5 has a light emitting section B1 of the end surface light emitting type which leads out light emission in the direction of arrow III in the figure. As described above, the present invention is applicable to a device of the end surface light emitting type.

Figure 7A:
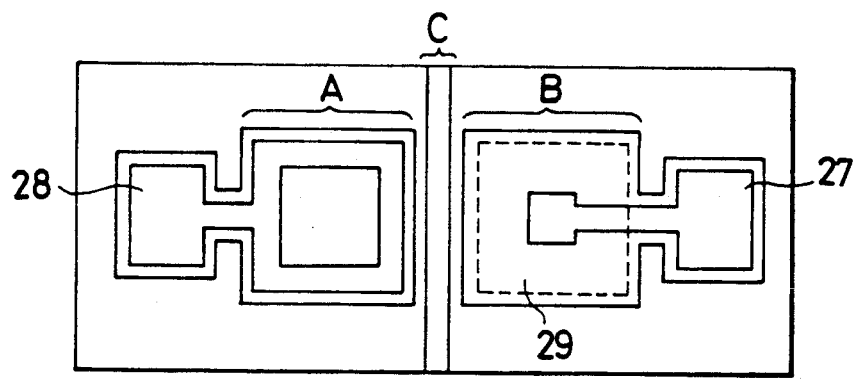
FIG. 7A is a top plan view illustrating the embodiment for the photo-functional device of the surface light emitting type in accordance with the present invention.
Figure 7B:
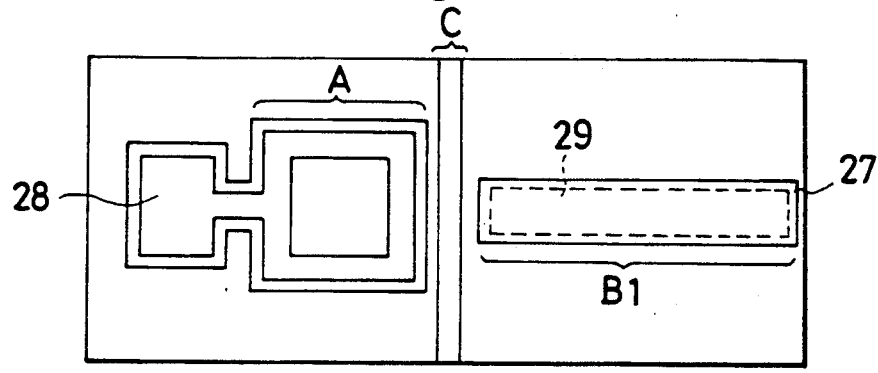
FIG. 7B is a top plan view illustrating the embodiment for the photo-functional device of the end surface light emitting type in accordance with the present invention.

FIG. 7A is a top plan view of a device of the surface light emitting type. FIG. 7B is a top plan view of a device of the end surface light emitting type. In these figures, only the mesa portion, the electrodes 27, 28 and the Zn-diffusion region 29 are designated by a numeral for the ease of understanding. Although both the light emitting section B and the light receiving section A of the photo-functional device of the surface light emitting type shown in FIG. 7A and the light receiving section A of the photo-functional device of the end surface light emitting type shown in FIG. 7B are formed in the form of a square, it goes without saying that the shape of the light emitting section B or the light receiving section A of these devices is not particularly limited to such a shape. The stripe width and length of the light emitting section B1 of a photo-functional device of the end surface light emitting type shown in FIG. 7B can be taken arbitrarily. In other words, the important point is that light feedback from the light emitting section B to the light receiving section A occurs.

Figure 8:
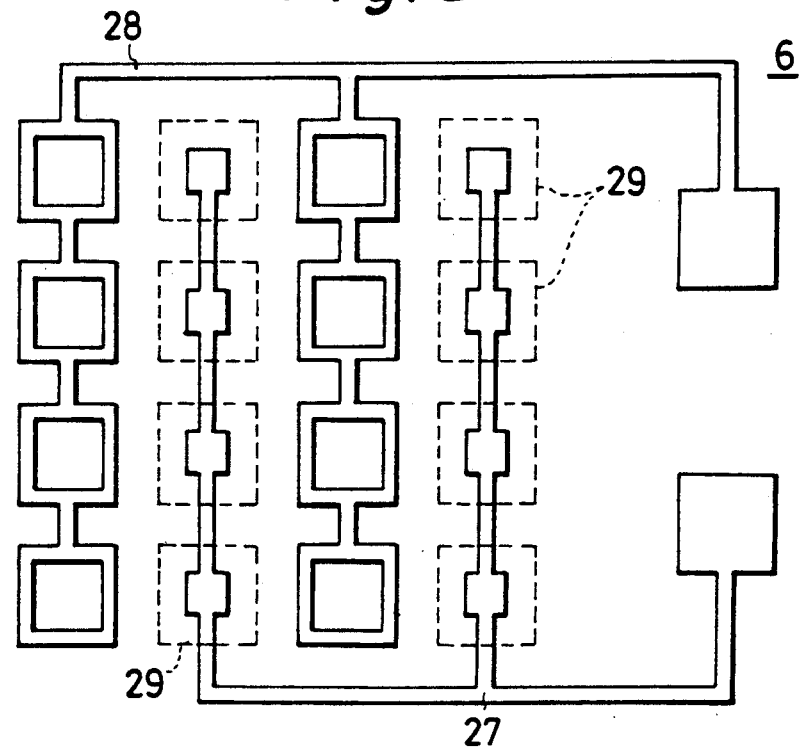
FIG. 8 is a top plan view of the arrayed device of the embodiment in which the photo-functional device in accordance with the present invention is made in the form of an array.
Figure 9:
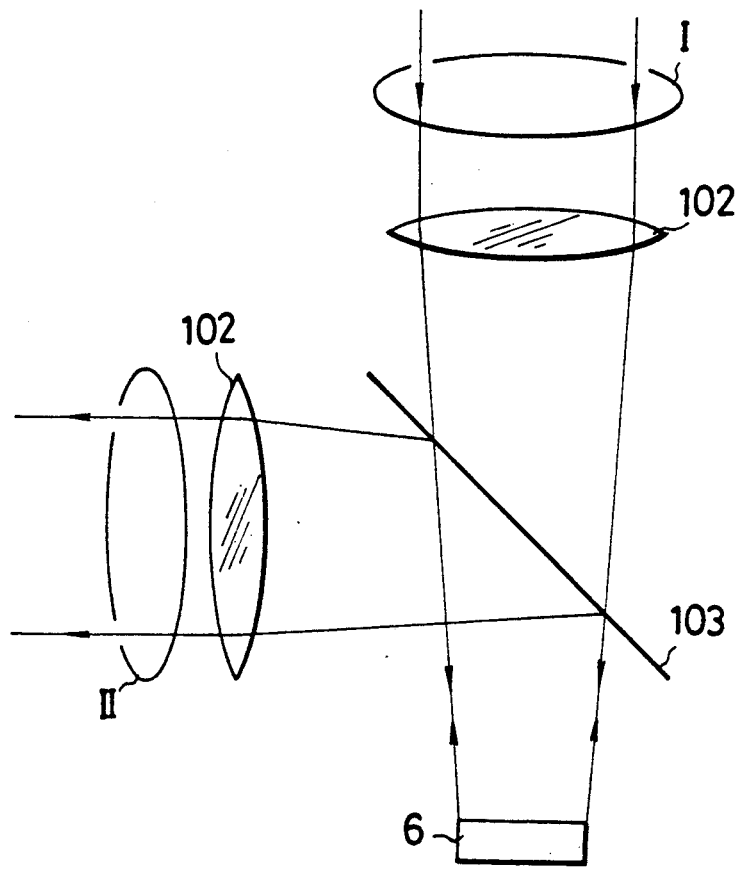
FIG. 9 is a configuration illustrating one example of configuration where the arrayed device exemplified in FIG. 8 is used for image processing.

FIG. 8 shows an example of an arrayed device in which the photo-functional device 1 of the embodiment 1 is integrated in the form of a two-dimensional array. In the figure, for the ease of understanding, only the numerals of the p-type ohmic electrode 27, the n-type ohmic electrode 28 and the impurity diffused region 29 are shown. In such arrayed device 6, non-linear or linear processing is performed on image information serving as input light and the result of it can be output from the light emitting section. That is, as shown in FIG. 9, since the input direction and the output direction can be changed differently by using the dichroic mirror 103, the arrayed device 6 can be applied easily to information processing such as image processing.

For the arrayed device 6 shown in FIG. 8, an example in which eight sets of photo-functional devices are integrated is shown. It is apparent that the present invention is not particularly limited to this number. The method of connecting the electrodes shown in the figure shows simply one example of the arrayed device 6. It is needless to say that actually various methods may be employed. Although the wavelength of light emission of the photo-functional device shown in theses embodiments is about 900 nm, since the wavelength for which light can be received is in a wide range of about 650 to 900 nm from the prohibition band width of the n-GaAs layer 23, the p-GaAs layer 24, and the n-$Al_xGa_{1-x}As$ ($0.1 < x < 0.5$) layer 25, the separation of input light from output light is easy. The photo-functional device of the present embodiment advantageously does not form an electrode on the substrate 21. That is, the photo-functional device of these embodiments can contact an all-surface heat sink in the aspect of heat dissipation. Therefore, they not only have excellent heat dissipation in an array of a large area, but they can be tightly supported by disposing this heat sink. For this reason, they can be put into use effectively as a device for information processing such as, particularly, image information processing.

GaAs based materials are used in the embodiment for the photo-functional device described above. However, the photo-functional device in accordance with the present invention are not particularly limited to the GaAs based materials. It goes without saying that other compound semiconductors, for example, InGaAsP based materials can be used for the photo-functional device of the present invention.

What is claimed is:

1. A photo-functional device comprising:
   an n-type semiconductor substrate;
   a light emitting means disposed on one face of said substrate by successively laminating an n-type AlGaAs layer, an n-type GaAs layer, a p-type GaAs layer, an n-type AlGaAs layer and an n-type GaAs layer in such a manner that Zn impurities are diffused into said layers from the uppermost n-type GaAs layer to the lower most n-type GaAs layer and a p-n junction is formed in said semiconductor layers;
   a light receiving means disposed on said one face of said substrate by successively laminating an n-type AlGaAs layer, an n-type GaAs layer, a p-type GaAs layer, an n-type AlGaAs layer and an n-type GaAs layer so as to form the same laminate as that of said light emitting means and to form a heterojunction phototransistor in the laminate thereof;
   a groove disposed between said light emitting means and said light receiving means for converting a coupling rate of light coupled from said light emitting means to said light receiving means, said groove reaching at least the lowermost n-type GaAs layer;
   two electrodes respectively disposed on a top face of said light emitting means and a top face of said light receiving means, the two electrodes being electrically connected in series;
   an insulation film disposed in said groove; and
   a metal layer disposed on an upper surface of said insulation film.

2. A photo-functional device comprising:
   an n-type semiconductor substrate;
   a light emitting means disposed on one face of said substrate by successively laminating an n-type AlGaAs layer, an n-type GaAs layer, a p-type GaAs layer, an n-type AlGaAs layer and an n-type GaAs layer in such a manner that Zn impurities are diffused into said layers from the uppermost n-type GaAs layer to the lower most n-type GaAs layer and a p-n junction is formed in said semiconductor layers;
   a light receiving means disposed on said one face of said substrate by successively laminating an n-type AlGaAs layer, an n-type GaAs layer, a p-type GaAs layer, an n-type AlGaAs layer and an n-type GaAs layer so as to form the same laminate as that of said light emitting means and to form a heterojunction phototransistor in the laminate thereof;
   a groove disposed between said light emitting means and said light receiving means for converting a coupling rate of light coupled from said light emitting means to said light receiving means, said groove reaching at least the lowermost n-type GaAs layer;
   two electrodes respectively disposed on a top face of said light emitting means and a top face of said light receiving means, the two electrodes being electrically connected in series;
   a light-absorbing insulating material buried in said groove.

* * * * *